United States Patent [19]

Doljack

[11] Patent Number: 4,789,767
[45] Date of Patent: Dec. 6, 1988

[54] AUTOREGULATING MULTI CONTACT INDUCTION HEATER

[75] Inventor: Frank A. Doljack, Pleasanton, Calif.
[73] Assignee: Metcal, Inc., Menlo Park, Calif.
[21] Appl. No.: 59,767
[22] Filed: Jun. 8, 1987
[51] Int. Cl.[4] .......................... H05B 6/40; B23K 1/00
[52] U.S. Cl. .................... 219/9.5; 219/10.57; 219/10.79; 219/10.75; 219/85 A
[58] Field of Search ............ 219/9.5, 8.5, 10.43, 219/10.49 X, 10.79, 10.57, 10.67, 10.71, 10.75, 85 A; 228/180.1

[56] References Cited

U.S. PATENT DOCUMENTS

| | | | |
|---|---|---|---|
| 2,448,012 | 8/1948 | Baker | 219/10.79 |
| 2,509,713 | 5/1950 | Achard | 219/10.49 R |
| 4,292,489 | 9/1981 | Gerber | 219/10.71 |
| 4,359,620 | 11/1982 | Keller | 219/10.79 X |
| 4,431,891 | 2/1984 | Forstner et al. | 219/9.5 |

FOREIGN PATENT DOCUMENTS 907100  6/1951  Fed. Rep. of Germany ... 219/10.79

Primary Examiner—Philip H. Leung
Attorney, Agent, or Firm—Hall, Myers & Rose

[57] ABSTRACT

Contacts of a multipin connector may be soldered to leads of a board of the like by forming coatings of magnetic materials on each contact and locating the contacts between poles defined by an air gap of the magnetic core, each pole having a separate pair of opposed pole pieces disposed adjacent a pair of contacts whereby upon application of a constant a.c. current to a coil wound about the core the magnetic material is heated to a temperature approaching its Curie temperature whereby temperature regulation occurs.

6 Claims, 1 Drawing Sheet

AUTOREGULATING MULTI CONTACT INDUCTION HEATER

BACKGROUND OF THE INVENTION

The present invention relates to soldering of complex structures and more particularly to strongly coupling magnetic flux into Curie point skin effect heater forming part of a complex shaped, surface mount.

The application of autoregulating Curie point heaters, such as disclosed in U.S. Pat. No. 4,256,945, to multipin surface mount connectors has proved to be a difficult task. Where single contact connectors are encountered, a heater, such as a soldering iron may be employed. Multiple contact connections of non-complex shapes have been suggested in U.S. patent application Ser. No. 746,796, assigned to the same assignee as the present invention.

Attempts at mounting complex shaped surface mount devices have employed inductive coupling to a Curie point heater but flux leakage problems have rendered these approaches inefficient, resulting in excessive Joule heating and potential damage to adjacent delicate electronic components.

BRIEF SUMMARY OF THE INVENTION

In accordance with the present invention a coil wound core of high resistance, low loss magnetic material has multiple, shaped pole pieces to concentrate flux in a ferromagnetic material forming part of each pin of a multipin connector whereby each pin is efficiently heated to a temperature approaching its Curie temperature at which temperature autoregulation becomes effective.

The core material may be powdered iron or a ferrite having resistivities as high as $10^9$ ohm-cms and having low hysteresis losses. Ferrites cover a wide range of Curie temperatures; 120° C.–500° C. and permeabilities; 20–5000. Powdered iron cores have very high Curie temperatures. By using such materials the eddy current and hysteresis losses and thus core losses are quite low. The arrangement permits the high flux density of the core to be transferred to the ferromagnetic heater further increasing efficiency and thus good autoregulation.

The cores may take the form of a rectangle having one side interrupted to provide opposed poles. The poles are intended to be disposed on opposite sides of a member forming the contact of a chip, or the like, the contact having a ferromagnetic covering whereby the pin becomes a self regulating heater.

The core may be shaped to accommodate a connector in its air gap; the connector having an array of contacts; the core having a separate shaped pole piece for each contact of the array whereby each pole piece concentrates flux into its juxtaposed contact. Curved, straight, wavy, irregular and like arrays can be accommodated.

DETAILED DESCRIPTION

Figure 1:
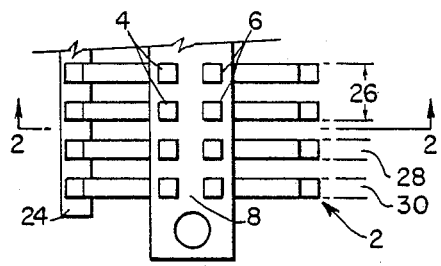
FIG. 1 is a top view of a multipin connector.
Figure 2:
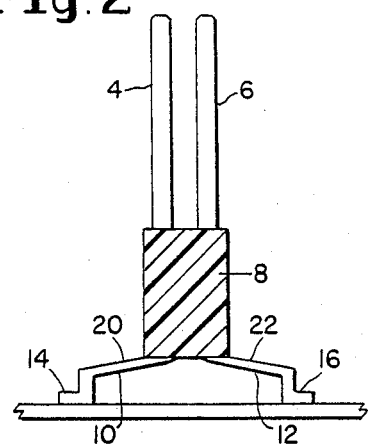
FIG. 2 is a side view of a multipin connector.

Referring now to FIGS. 1 and 2 of the accompanying drawings, there is illustrated a multipin connector 2 to be secured to a circuit board or the like. The connector comprises a plurality of upstanding pins 4 and 6 secured in base 8 of insulating material. The pins 4 and 6 terminate below the base 8 in outwardly extending conductive legs 10 and 12, respectively, have feet 14 and 16 intended to contact, for instance, a printed circuit board 18. As can be seen in the example of the multipin connector of FIG. 1, a connector may have two rows of pins of indefinite numbers each, eight being illustrated in two rows of four each.

The legs 10 and 12 have coverings 20 and 22 respectively, on all surfaces except the contact surface, of ferromagnetic material which has an effective Curie temperature sufficient to melt solder or the like. The connector is to have each foot soldered to a different printed circuit lead or in some instances two or more to the same lead. As an example, the left feet of FIG. 1 are all secured to a lead 24, the upper two feet on the right side are to be connected to a lead 26 and the lower two right side feet are to be connected to separate leads 28 and 30.

Figure 3:
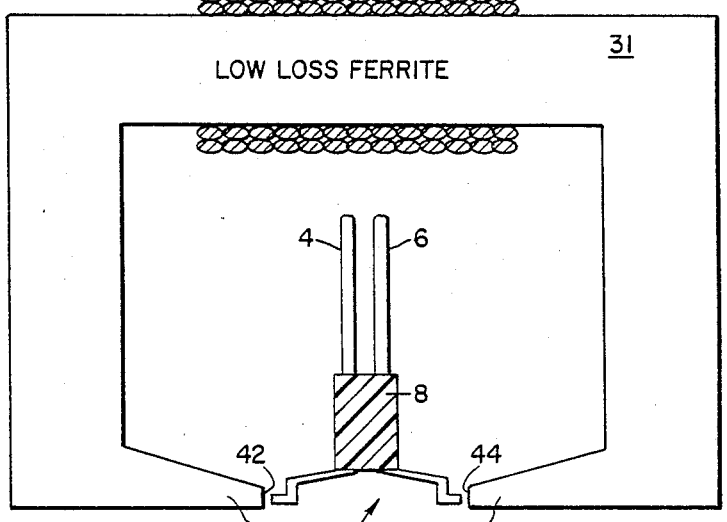
FIG. 3 is a side view of a core with a multipin connector in its air gap.
Figure 4:
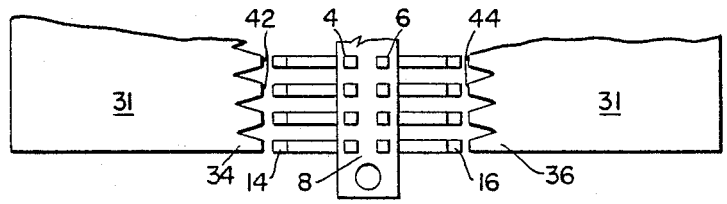
FIG. 4 is a top view of a core with a multipin connector in its air gap.

Referring now to FIGS. 3 and 4, there is provided a heater energizer circuit comprising a high impedance generally rectangular core 31 having a gap 32 lying between poles 34 and 36 of the core. The core has a winding 38 disposed about a side 40 opposite gap 32. The core is elongated perpendicular to the plane of the core, i.e. the plane of the page as illustrated in FIG. 3. Each pole is provided with a plurality of triangular slots or recesses to define a plurality of shaped pole pieces 42 on one side of the gap and pole pieces 44 on the the side of the gap. Each of the pole pieces 42 is aligned with a different pole piece 44 on the other side of the gap so that a direct flux path is established between each pair of opposed pole pieces.

When in use, the core 31 is positioned with each pair of opposed pole pieces having located therebetween opposed feet 4 and 6 of the multipin connector 2 of FIGS. 1 and 2. The magnetic materials 20 and 22 complete the magnetic path across the gap whereby a path of low reluctance is established. Upon energization of coil 38 with a constant alternating current, the magnetic materials 20 and 22 are heated to a temperature approaching their Curie temperatures. When the temperatures have risen sufficiently, the materials 20 and 22 become paramagnetic and since the current is constant and the available current now spreads into the low resistance material 10 and 12, copper, for instance, heating is materially reduced, the temperature of the members falls, the members 20 and 22 become magnetic, the cycle is repeated and autoregulation results.

The pole pieces 34 and 36 are shaped so as to concentrate flux in the magnetic layers 20 and 22 and are located very close to and in some instances in contact with the layers 20 and 22 to minimize magnetic reluctance of the path. Also in multipin connectors of the type under consideration the gap between the legs 10 and 12 is quite small further contributing to a low reluctance magnetic path.

Figure 5A:
FIGS. 5A, 5B and 5C illustrate different configurations of the contacts of multipin connectors.
Figure 5B:
Figure 5C:

The array of pole pieces does not have to be straight and the pole pieces do not have to be rectangular. A curved or even wavy or irregular array of pole pieces is permitted all as illustrated in FIGS. 5A, 5B and 5C. Also the pole pieces can be cylindrical to avoid sharp corners that induce leakage flux. It should be noted that the current supplied relative to the minimum cross-sectional area of the magnetic path should be such that saturation does not occur along the magnetic path. Saturation, it must be realized, greatly increases leakage flux and contributes to inefficient operation and in the presence of sensitive components can destroy a chip or the like.

The material of the core is preferably a powdered iron or a ferrite. One appropriate ferrite is available from Fair Rite Products as Product No. 861103001. This material is a ferric oxide mixed with other oxides, has a mu of approximately 125 and a conductivity of approximately $10^{-9}$ ohm-cms.

The term "constant current" as employed herein does not mean a current that cannot increase, but means a current that obeys the following formula $$\frac{\Delta |I|}{|I|} > -\tfrac{1}{2} \frac{\Delta R}{R}$$

where I is the load current. Specifically, in order to autoregulate, the power delivered to the load when the heater exceeds Curie temperature, must be less than the power delivered to the load below Curie temperature. If the current is held invariable, then the best autoregulating ratio is achieved short of controlling the power supply to reduce current. So long, however, that the current is controlled in accordance with the above formula, autoregulation is achieved. Thus, when large self regulating ratios are not required, constraints on the degree of current control may be relaxed thus reducing the cost of the power supply.

The above equation is derived by analyzing the equation:

$$P = [I^2 R]$$

where P is power and I is the current in the load. Differentiating with respect to R $$\frac{dP}{dR} = |I|^2 + 2R|I|\frac{dI}{dR}$$

to satisfy the requirements for self regulation dP/dR>0. Thus, $$|I^2| + 2R|I|\frac{d|I|}{dR} > 0$$

which reduces to the above equation. It should be noted, however, that the more constant the current the better the self regulation.

Once given the above disclosure, many other features, modifications and improvements will become apparent to the skilled artisan. Such other modifications, features and improvements are, therefore, considered a part of this invention, the scope of which is to be determined by the following claims.

What is claimed is:

1. In a device for soldering a multipin connector to a support wherein the multipin connector has a plurality of contacts for establishing electrical contact between pins of the connector and conductors on a support, each contact having a ferromagnetic material thereon with an effective Curie temperature above the melting point of a fusible material employed to secure each contact to a conductor of a support, an energizer comprising
   a core of a high electrical impedance, high permeability material,
   said core having opposed poles defining an air gap of approximately the size of said contacts of said multipin connector to be heated,
   each said pole having pole pieces spaced apart by said distance equal to the spacing between contacts of a multipin connector, and
   a coil wound to establish flux across said air gap,
   said coil being adapted to be connected across a source of alternating current.

2. An energizer according to claim 1 wherein said core has a conductivity of at least $10^{-8}$ ohm-cms.

3. An energizer according to claim 1 wherein ends of said pole pieces define a curved configuration.

4. A system for soldering a multipin connector to a support, said system comprising
   a support for a plurality of conductors,
   a multipin connector having a plurality of contacts,
   each contact including a ferromagnetic material having a Curie temperature above the melting point of a fusible material employed to secure each contact to a conductor on said support, and
   means for individually heating each contact,
   said means including
   a core of a high electrical impedance, high permeability material,
   said core having opposed poles defining an air gap of approximately the size of said contacts of said multipin connector to be heated,
   each said pole having pole pieces spaced apart by a distance equal to the spacing between contacts of a multipin connector, and
   a coil wound to establish flux across said air gap,
   said coil having means for connecting it across a source of alternating current.

5. A system according to claim 4 wherein said core is a less ferrite material.

6. The system according to claim 1 or claim 4 wherein said source is a constant current source.

* * * * *